US012569917B2

(12) United States Patent
Ono et al.

(10) Patent No.: US 12,569,917 B2
(45) Date of Patent: Mar. 10, 2026

(54) CUTTING TOOL

(71) Applicant: Sumitomo Electric Industries, Ltd., Osaka (JP)

(72) Inventors: Satoshi Ono, Osaka (JP); Anongsack Paseuth, Osaka (JP); Katsumi Okamura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 160 days.

(21) Appl. No.: 18/279,625

(22) PCT Filed: Mar. 4, 2022

(86) PCT No.: PCT/JP2022/009461

§ 371 (c)(1),
(2) Date: Aug. 31, 2023

(87) PCT Pub. No.: WO2022/230360

PCT Pub. Date: Nov. 3, 2022

(65) Prior Publication Data

US 2024/0139825 A1 May 2, 2024

(30) Foreign Application Priority Data

Apr. 30, 2021 (JP) ................................. 2021-078023

(51) Int. Cl.

| | |
|---|---|
| *B23B 27/14* | (2006.01) |
| *C23C 16/30* | (2006.01) |
| *C23C 16/34* | (2006.01) |
| *C23C 16/36* | (2006.01) |
| *C23C 16/40* | (2006.01) |

(52) U.S. Cl.
CPC .......... *B23B 27/148* (2013.01); *C23C 16/308* (2013.01); *C23C 16/34* (2013.01);
(Continued)

(58) Field of Classification Search
None
See application file for complete search history.

(56) References Cited

U.S. PATENT DOCUMENTS

2011/0188950 A1* 8/2011 Ahlgren ................ C23C 14/024
427/580
2014/0370309 A1 12/2014 Endler et al.
(Continued)

FOREIGN PATENT DOCUMENTS

| JP | H11-124672 A | 5/1999 |
|---|---|---|
| JP | 2004-066361 A | 3/2004 |

(Continued)

OTHER PUBLICATIONS

Ma, et al., "Enhanced discharge and surface properties of TiSiCN coatings deposited by pulse-enhanced vacuum arc evaporation", Sep. 16, 2020, Surface & Coatings Technology, vol. 403, p. 126413 (Year: 2020).*

(Continued)

*Primary Examiner* — Seth Dumbris
(74) *Attorney, Agent, or Firm* — XSENSUS LLP

(57) ABSTRACT

A cutting tool comprising a base material and a coating disposed on the base material, wherein the coating comprises a hard particle layer; the hard particle layer is formed from a plurality of hard particles including titanium, silicon, carbon, and nitrogen; in the hard particles, a concentration of the silicon periodically changes along a first direction set in the hard particles; and an orientation of the hard particle layer is a (311) orientation.

15 Claims, 5 Drawing Sheets

(52) U.S. Cl.
CPC ............ *C23C 16/36* (2013.01); *C23C 16/403*
(2013.01); *B23B 2228/105* (2013.01)

(56) References Cited

U.S. PATENT DOCUMENTS

2019/0070668 A1\*  3/2019  Sato ........................ B23B 27/14
2020/0298317 A1  9/2020  Ono et al.

FOREIGN PATENT DOCUMENTS

JP        2004-090150  A    3/2004
JP        2005-138209  A    6/2005

JP        2015-505902  A    2/2015
WO        2009/128782  A1   10/2009
WO        2019/176201  A1   9/2019

OTHER PUBLICATIONS

Imamura et al., "Properties and cutting performance of AlTiCrN/
TiSiCN bilayer coatings deposited by cathodic-arc ion plating",
Surface and Coatings Technology, vol. 202, Jun. 2, 2007, pp.
820-825.
H. Xu et al., "Tribological behavior of a TiSiCN coating tested in
air and coolant", Surface and Coatings Technology, vol. 201, Dec.
20, 2006, pp. 4236-4241.

\* cited by examiner

× 100,000

×2,000,000

CUTTING TOOL

CROSS-REFERENCE TO RELATED APPLICATIONS

The present application is based on PCT filing PCT/JP2022/009461, filed Mar. 4, 2022, which claims priority to Japanese Patent Application No. 2021-078023, filed Apr. 30, 2021, the entire contents of each are incorporated herein by reference.

TECHNICAL FIELD

The present disclosure relates to a cutting tool.

BACKGROUND ART

Conventionally, in order to improve the wear resistance of a cutting tool, a cutting tool having a TiSiCN film formed on a base material has been developed.

PTL 1 discloses a nanocomposite coating comprising a nanocrystalline layer of $Ti_xN_{1-x}$ manufactured by a thermal CVD and a second phase of amorphous $SiC_xN_y$.

NPL 1 discloses a TiSiCN coating having a nanocomposite structure formed by a PVD method.

CITATION LIST

Patent Literature

PTL 1: Japanese National Patent Publication No. 2015-505902

Non Patent Literature

NPL 1: Shinya Imamura et al., "Properties and cutting performance of AlTiCrN/TiSiCN bilayer coatings deposited by cathodic-arc ion plating", Surface and Coatings Technology, 202, (2007), 820-825

SUMMARY OF INVENTION

The cutting tool of the present disclosure is a cutting tool comprising a base material and a coating disposed on the base material, wherein the coating comprises a hard particle layer,
the hard particle layer is formed from a plurality of hard particles including titanium, silicon, carbon, and nitrogen,
in the hard particles, a concentration of the silicon periodically changes along a first direction set in the hard particles, and
an orientation of the hard particle layer is a (311) orientation.

DETAILED DESCRIPTION

Figure 1:
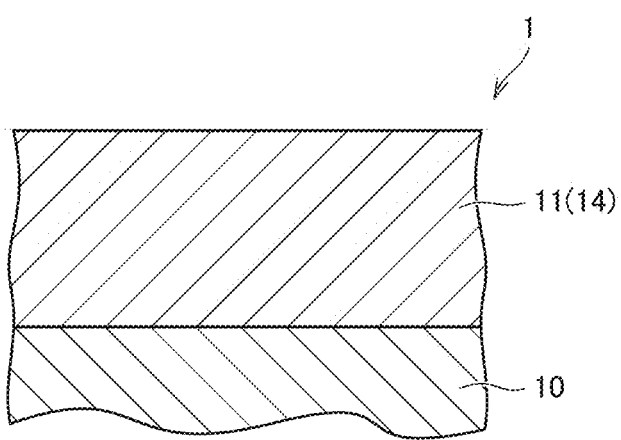
FIG. 1 is a schematic diagram showing one example of a cross section of a cutting tool according to Embodiment 1.

Problem to be Solved by the Present Disclosure

In recent years, there has been an ever-increasing demand for manufacturing cost reduction, and a cutting tool having a long tool life has been demanded.

Accordingly, an object of the present disclosure is to provide a cutting tool having a long tool life.

Advantageous Effect of the Present Disclosure

According to the present disclosure, it is possible to provide a cutting tool having a long tool life.

Description of Embodiments

First, aspects of the present disclosure will be listed and described.

(1) The cutting tool of the present disclosure is a cutting tool comprising a base material and a coating disposed on the base material, wherein the coating comprises a hard particle layer,
the hard particle layer is formed from a plurality of hard particles including titanium, silicon, carbon, and nitrogen,
in the hard particles, a concentration of the silicon periodically changes along a first direction set in the hard particles, and
an orientation of the hard particle layer is a (311) orientation.

According to the present disclosure, the cutting tool can have a long tool life.

(2) in the hard particles, an average of a percentage of the number of atoms of the silicon, $A_{Si}$, to a sum of the number of atoms of the titanium, $A_{Ti}$, and the number of atoms of the silicon, $A_{Si}$, $\{A_{Si}/(A_{Si}+A_{Ti})\}\times100$, is preferably 1% or more and 20% or less.

According to this, the tool life of the cutting tool is further improved.

(3) An average period width of a concentration of the silicon is preferably 3 nm or more and 50 nm or less. According to this, the tool life of the cutting tool is further improved.

(4) A thickness of the hard particle layer is preferably 1 $\mu m$ or more and 20 $\mu m$ or less. According to this, the tool life of the cutting tool is further improved.

(5) The base material is formed from a cemented carbide including tungsten carbide and cobalt, and a content of the cobalt in the cemented carbide is preferably 6% by mass or more and 11% by mass or less.

According to this, the tool life of the cutting tool is further improved.

(6) In the hard particles, a difference between a maximum value and a minimum value of a percentage of the number of atoms of the silicon, $A_{Si}$, to a sum of the number of atoms of the titanium, $A_{Ti}$, and the number of atoms of the silicon, $A_{Si}$, $\{A_{Si}/(A_{Si}+A_{Ti})\}\times100$, is preferably 1% or more and 38% or less.

According to this, the film hardness and the toughness of the hard particle layer are improved.

(7) Preferably, the coating comprises a base layer disposed directly on the base material, and the base layer consists of at least one selected from the group consisting of a TiN layer, a TiC layer, a TiCN layer, a TiBN layer, and an $Al_2O_3$ layer.

By disposing a TiN layer, a TiC layer, a TiCN layer, or a TiBN layer directly on the base material as the base layer, the close adhesion between the base material and the coating can be enhanced. In addition, by using an $Al_2O_3$ layer as the base layer, the oxidation resistance of the coating can be enhanced.

(8) Preferably, the coating comprises an outermost layer disposed closest to the surface of the coating, and the outermost layer consists of a layer including 90% by mass or more of titanium carbide, titanium nitride, or titanium boride, or an $Al_2O_3$ layer.

The use of a layer including 90% by mass or more of titanium carbide, titanium nitride, or titanium boride as the outermost layer has the advantage of easy identification of a corner of a cutting insert after used for cutting (identification of a used site). In addition, by using an $Al_2O_3$ layer as the outermost layer, the oxidation resistance of the coating can be enhanced.

DETAILS OF THE EMBODIMENTS OF THE PRESENT DISCLOSURE

With reference to the drawings, specific examples of the cutting tool according to the present disclosure will be described below. In the drawings of the present disclosure, the same reference signs represent the same portions or equivalent portions. In addition, a dimensional relationship such as length, width, thickness, or depth is appropriately changed for clarity and simplification of the drawings, and does not necessarily represent an actual dimensional relationship.

As used herein, the expression of a range in the format "A to B" means the upper limit and the lower limit of the range (that is, A or more and B or less), and when no unit is written in A and a unit is only written in B, the unit for A and the unit for B are the same.

As used herein, when a compound or the like is represented by a chemical formula, if the atomic ratio is not particularly limited, the chemical formula shall include all conventionally known atomic ratios, and should not necessarily be limited only to those within the stoichiometric range. For example, when "TiSiCN" is provided, the ratio of the numbers of atoms constituting TiSiCN includes all conventionally known atomic ratios.

As used in the present disclosure, when one or more numerical values are written as each of the lower limit and the upper limit of a numerical range, a combination of any one numerical value written as the lower limit and any one numerical value written as the upper limit shall also be disclosed. For example, when a1 or more, b1 or more, and c1 or more are written as the lower limit, and a2 or less, b2 or less, and c2 or less are written as the upper limit, a1 or more and a2 or less, a1 or more and b2 or less, a1 or more and c2 or less, b1 or more and a2 or less, b1 or more and b2 or less, b1 or more and c2 or less, c1 or more and a2 or less, c1 or more and b2 or less, and c1 or more and c2 or less shall be disclosed.

Embodiment 1: Cutting Tool

The cutting tool of one embodiment of the present disclosure (hereinafter also referred to as "the present embodiment") is a cutting tool comprising a base material and a coating disposed on the base material, wherein the coating comprises a hard particle layer, the hard particle layer is formed from a plurality of hard particles including titanium, silicon, carbon, and nitrogen, in the hard particles, a concentration of the silicon periodically changes along a first direction set in the hard particles, and an orientation of the hard particle layer is a (311) orientation.

The cutting tool of the present disclosure can have a long tool life. The reasons for this are presumed to be as shown (i) to (iii) below.

(i) In the cutting tool of the present embodiment, the coating includes a hard particle layer formed from a plurality of hard particles including titanium, silicon, carbon, and nitrogen. The hard particles including titanium, silicon, carbon, and nitrogen have high hardness. Therefore, the hard particle layer formed from the hard particles has high hardness and excellent wear resistance.

(ii) in the hard particles of the cutting tool of the present embodiment, the concentration of silicon periodically changes along a first direction set in the hard particles. According to this, strain occurs in the hard particles, the hardness of the hard particles and the hard particle layer are increased, and the wear resistance of the cutting tool is improved. In addition, the composition change in the hard particles suppresses the propagation of a crack and improves the breakage resistance of the cutting tool.

(iii) In the cutting tool of the present embodiment, the orientation of the hard particle layer is the (311) orientation. When the orientation of the hard particle layer is the (311) orientation, the toughness of the hard particle layer is improved because of the low Young's modulus. A cutting tool including the hard particle layer exhibits excellent breakage resistance, particularly in steel cutting. This is a finding newly found by the present inventors <Configuration of Cutting Tool>

As shown in FIG. 1, a cutting tool 1 of the present embodiment includes a base material 10 and a coating 14 disposed on base material 10. In FIG. 1, coating 14 is constituted only by a hard particle layer 11. Coating 14 preferably coats at least a part of a portion of the base material involved in cutting, and more preferably coats the entire surface of the base material. The term portion of the base material involved in cutting means a region within a distance of 500 μm front the cutting edge ridgeline on the surface of the base material. Even if a part of the base material is not coated with the coating or the configuration of the coating is partially different, this does not depart from the scope of the present embodiment.

The coating can include a different layer in addition to the hard particle layer. For example, as shown in a cutting tool 21 of FIG. 2, a coating 24 can further include, in addition to a hard particle layer 11, a base layer 12 disposed between a base material 10 and hard particle layer 11.

Figure 3:
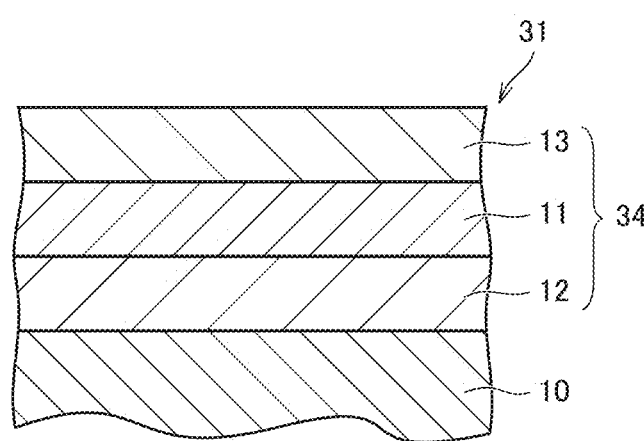
FIG. 3 is a schematic diagram showing a different example of the cross section of the cutting tool according to Embodiment 1.

As shown in a cutting tool 31 of FIG. 3, a coating 34 can include, in addition to a hard particle layer 11 and a base layer 12, an outermost layer 13 disposed on hard particle layer 11.

Figure 4:
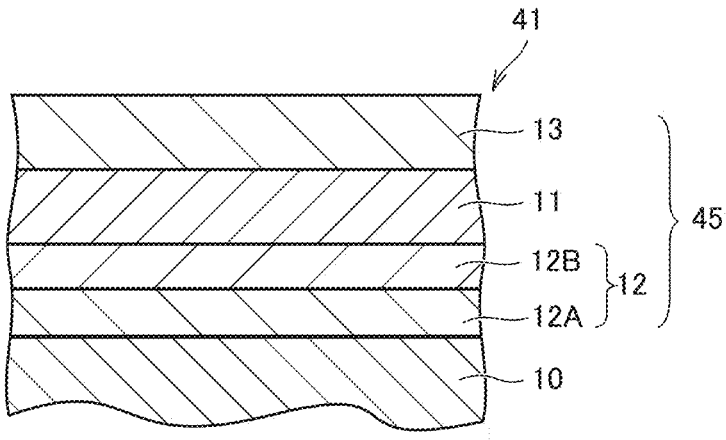
FIG. 4 is a schematic diagram showing a different example of the cross section of the cutting tool according to Embodiment 1.

As shown in a cutting tool 41 of FIG. 4, a coating 45 can include a hard particle layer 11, a base layer 12 consisting of a two-layer structure of a first base layer 12A and a second base layer 12B, and an outermost layer 13.

<Type of Cutting Tool>

The cutting tool of the present disclosure can be a drill, an end mill (for example, a ball end mill), an indexable cutting insert for a drill, an indexable cutting insert for an end mill, an indexable cutting insert for milling working, an indexable cutting insert for turning working, a metal saw, a gear cutting tool, a reamer, a tap, or the like.

<Base Material>

Base material 10 includes a rake face and a flank face, and any base material can be used as long as it is conventionally known as a base material of this type. For example, the base material is preferably any of a cemented carbide (for example, WC-base cemented carbide including tungsten carbide and cobalt, the cemented carbide can include a carbonitride of Ti, Ta, Nb, or the like), a cermet (including TiC, TiN, TiCN, or the like as a main component), high-speed steel, a ceramic (such as titanium carbide, silicon carbide, silicon nitride, aluminum nitride, or aluminum oxide), a cubic boron nitride sintered material, and a diamond sintered material.

Among these various base materials, a base material formed from a cemented carbide including tungsten carbide and cobalt wherein the content of cobalt in the cemented carbide is 6% by mass or more and 11% by mass or less is preferable. According to this, the base material has an excellent balance between hardness and strength at a high temperature, and has excellent properties as a base material for a cutting tool for the above uses. When a WC-base cemented carbide is used as the base material, the structure thereof may include free carbon, an abnormal layer referred to as an η phase or an s phase, or the like.

Further, the base material may have the surface thereof modified. For example, in the case of a cemented carbide, a β-free layer may be formed on the surface thereof, and in the case of a cermet, a hardened surface layer may be formed. The base material exhibits the desired effect even if the surface thereof has been modified.

When the cutting tool is an indexable cutting insert or the like, the base material may or may not have a chip breaker. As the shape of the cutting edge ridgeline portion, any shape of a sharp edge (a ridge where a rake face and a flank face intersect), a honing (a shape obtained by rounding a sharp edge), a negative land (a chamfered shape), a shape obtained by combining a honing and a negative land, and the like can be adopted.

<Configuration of Coating>

The coating of the present embodiment includes a hard particle layer. The coating of the present embodiment may include a different layer as long as the coating includes a hard particle layer. Examples of the different layer include a base layer and an outermost layer. The details of the hard particle layer, the base layer, and the outermost layer will be described later.

The thickness of the entire coating is preferably 1 μm or more and 30 μm or less. When the thickness of the entire coating is 1 μm or more, the coating can have excellent wear resistance. On the other hand, when then the thickness is 30 μm or less, it is possible to suppress the occurrence of peeling or destruction of the coating when a large stress is applied between the coating and the base material in interrupted working.

The thickness of the coating is measured, for example, by obtaining a cross-sectional sample parallel to the normal direction of the surface of the base material and observing this sample with a scanning transmission electron microscope (STEM). The cross-sectional sample is a thin sliced sample worked by using an ion slicer or the like. Examples of the scanning transmission electron microscope include JEM-2100F (trademark) manufactured by JEOL Ltd. The measurement conditions are an acceleration voltage of 200 kV and an amount of current of 0.3 nA.

As used herein, when the term "thickness" is used, the thickness means the average thickness Specifically, the observation magnification of a cross-sectional sample is 1000 times, and a rectangular measurement field of view of (100 μm in the direction parallel to the base material surface)×(distance including the total thickness of the coating) is set on an electron microscope image, the thickness widths at 10 locations are measured in the field of view, and the average value thereof is defined as the "thickness." The thickness (average thickness) of each layer described below is also similarly measured and calculated.

It has been confirmed that as long as the measurement is carried out on the same sample, even if the measurement is carried out a plurality of times by changing the selection location of the measurement field of view, there is little variation in the measurement results, and that even if the measurement field of view is arbitrarily set, it is not contrived.

<Hard Particle Layer>

The hard particle layer is formed from a plurality of hard particles including titanium (Ti), silicon (Si), carbon (C), and nitrogen (N). Examples of the hard particles include TiSiCN particles consisting of titanium, silicon, carbon, and nitrogen. TiSiCN particles can include an unavoidable impurity other than titanium, silicon, carbon, and nitrogen as long as the impurity does not affect the effect of the present disclosure. Even if as the inevitable impurity, for example, an amorphous phase or an intermetallic compound (for example, $TiSi_2$ or $Co_2Si$) is included, this does not deviate from the scope of the present disclosure as long as the effect of the present disclosure is exhibited.

(Hard Particles)

In the hard particles, the concentration of silicon periodically changes along a first direction set in the hard particles. As used herein, the first direction is defined as a direction specified by the method described in (A1) to (A4) below.

(A1) A cutting tool is cut out with a diamond wire along the normal line of the rake face of the base material to expose a cross section of the hard particle layer. At this time, as a measurement sample, a thin sliced sample worked by using an ion slicer or the like is prepared.

Figure 5:
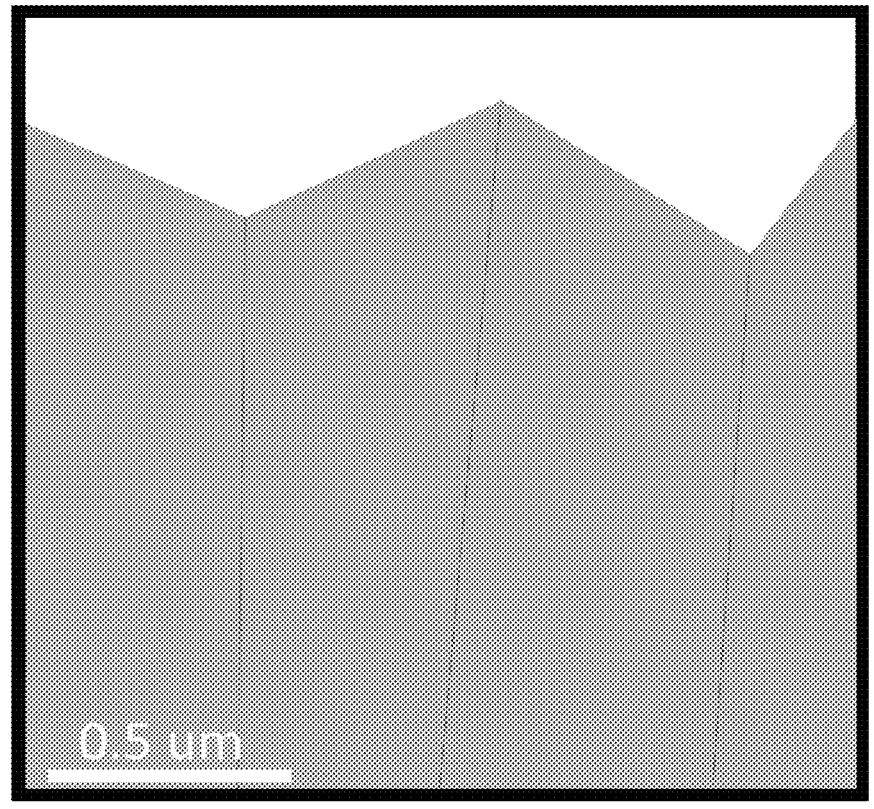
FIG. 5 is a diagram schematically showing one example of a bright-field scanning transmission electron microscope (BF-STEM) image (observation magnification: 100000 times) of a cross section of a hard phase particle layer of the cutting tool according to Embodiment 1.
Figure 6:
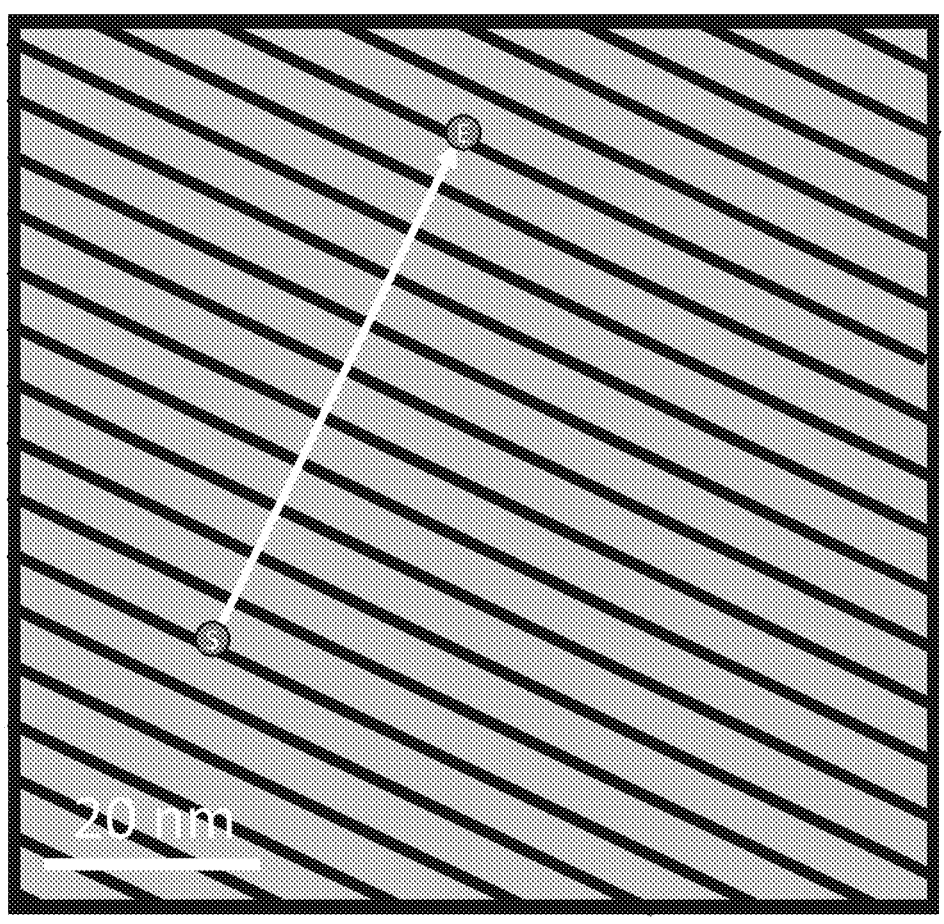
FIG. 6 is a diagram schematically showing one example of a bright-field scanning transmission electron microscope (BF-STEM) image (observation magnification: 2000000 times) of a cross section of a hard phase particle layer of the cutting tool according to Embodiment 1.

(A2) The worked thin sliced sample is observed with a bright-field scanning transmission electron microscope (BF-STEM) at a magnification of 100000 to identify one hard particle. FIG. 5 is a diagram schematically showing one example of a BF-STEM image (observation magnification: 100000 times) of the hard particle layer of the present embodiment. Next, the one hard particle identified is observed at a magnification of 2000000 times to obtain a BF-STEM image FIG. 6 is a diagram schematically showing one example of a BF-STEM image (observation magnification: 2000000 times) of the one hard particle identified in FIG. 5.

(A3) On the BF-STEM image (observation magnification: 2000000 times), a region in which a layer shown in black (hereinafter also referred to as a "first unit layer") and a layer shown in gray (hereinafter also referred to as a "second unit layer") are alternately laminated approximately parallel (hereinafter also referred to as a "lamination region") is identified. The first unit layer shown in black is a region having a high silicon content, and the second unit layer shown in gray is a region having a low silicon content.

(A4) The lamination direction of the first unit layer (layer shown in black) and the second unit layer (layer shown in gray) is identified in the lamination region identified above. Specifically, a selected area region electron beam diffraction pattern and the lamination direction of the first unit layer and the second unit layer are superimposed on each other to identify the lamination direction by using an orientation shown by diffraction spots in FIG. 6, the lamination direction of the first unit layer and the second unit layer is shown by an arrow from a circled S to a circled E. As used herein, the lamination direction is defined as the first direction.

From the above, as used herein, the first direction can also be defined as the direction along the lamination direction in the hard particles.

In the hard particle layer of the present embodiment, the line along the first direction intersects the interface between the base material and the coating at a predetermined angle of 45° or more and 90° or less.

Herein, it is confirmed by the following method that the concentration of silicon in the hard particles periodically changes along the first direction set in the hard particles.

(B1) In the BF-STEM image (observation magnification: 2000000 times), line analysis is carried out along the first direction by EDX (Energy Dispersive X-ray Spectroscopy) attached to STEM to measure the content $A_{Ti}$ based on the number of atoms of titanium and the content $A_{Si}$ based on the number of atoms of silicon. The beam diameter for line analysis is 0.5 nm or less, the scan interval is 0.5 nm, and the length of line analysis is 50 nm.

(B2) A graph showing the line analysis results in a coordinate system in which the X axis represents the distance (nm) along the first direction from the start point of the line analysis, and the Y axis represents the percentage of the number of atoms of silicon, $A_{Si}$, to the sum of the number of atoms of silicon, $A_{Si}$, and the number of atoms of titanium, $A_{Ti}$, ($\{A_{Si}/(A_{Si}+A_{Ti})\}\times100$) (%), is obtained. The graph shows the change in the percentage (Y axis) of the number of atoms of silicon, $A_{Si}$, to the sum of the number of atoms of silicon, $A_{Si}$, and the number of atoms of titanium, $A_{Ti}$, with an increasing distance (X axis) along the first direction from the start point of the line analysis.

Figure 7:
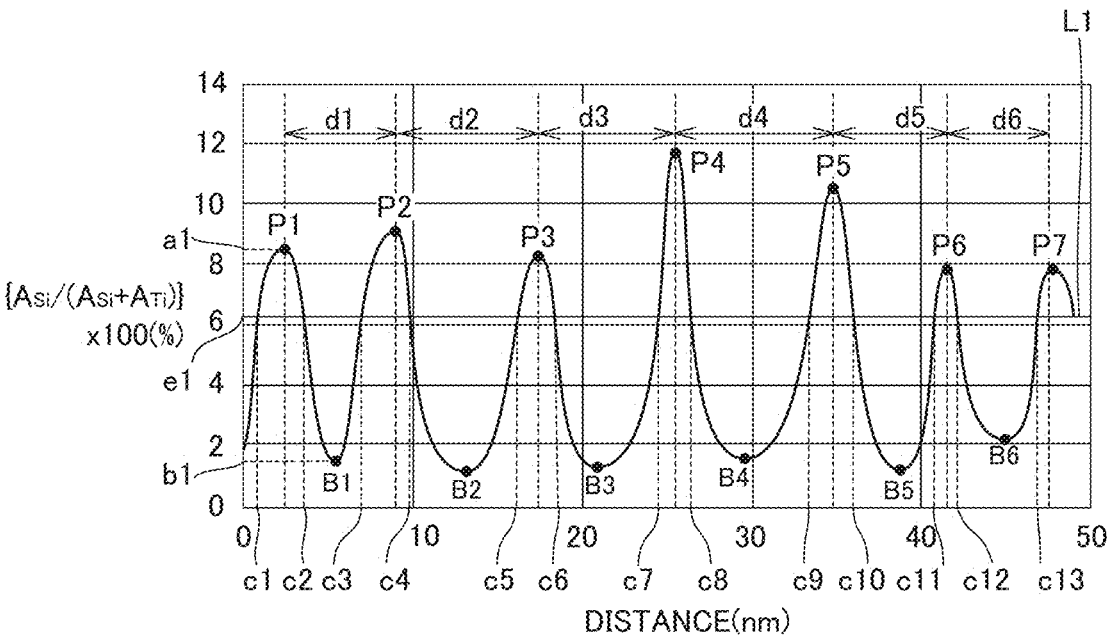
FIG. 7 is one example of a graph showing results of line analysis of hard particles of the cutting tool according to Embodiment 1.

One example of a graph obtained by carrying out line analysis on the arrow from the circled S to the circled E on the BF-STEM image of FIG. 6 is shown in FIG. 7.

(B3) A line L1 showing the average value of $\{A_{Si}/(A_{Si}+A_{Ti})\}\times100$ is drawn on the graph. In FIG. 7, the average value of $\{A_{Si}/(A_{Si}+A_{Ti})\}\times100$ is e1. The average value e1 is shown by line L1.

(B4) In the graph, when a region in which the value of $\{A_{Si}/(A_{Si}+A_{Ti})\}\times100$ is larger than line L1 (hereinafter also referred to as a "first A region") and a region in which the value of $\{A_{Si}/(A_{Si}+A_{Ti})\}\times100$ is smaller than line L1 (hereinafter also referred to as a "first B region") are alternately present continuously along the first direction, it is determined that the concentration of silicon in the hard particles periodically changes along the first direction set in the hard particles. Here, a region in which $\{A_{Si}/(A_{Si}+A_{Ti})\}\times100$ is the same as the average value is regarded as a first A region.

In FIG. 7, the first A region is, for example, a region in which the distance along the first direction from the start point of the line analysis is c1 or more and c2 or less, c3 or more and c4 or less, c5 or more and c6 or less, c7 or more and c8 or less, c9 or more and c0 or less, or c11 or more and c12 or less (description is omitted for a distance greater than c13) In FIG. 7, the first B region is, for example, a region in which the distance along the first direction from the start point of the line analysis is more than c2 and less than c3, more than c4 and less than c5, more than c6 and less than c7, more than c8 and less than c9, more than c10 and less than c11, or more than c12 and less than c13.

In each first A region, from the point closest to the start point of the line analysis, the value of $\{A_{Si}/(A_{Si}+A_{Ti})\}\times100$ preferably increases from the average value to the maximum value within the first A region and then decreases to the average value, as the distance from the start point of the line analysis increases.

The above increase in the first A region is not limited to a monotonous increase, and in the middle of the increase, a decrease within 50% of the difference between the average value of the values of $\{A_{Si}/(A_{Si}+A_{Ti})\}\times100$ and the maximum value within the first A region may be present. In addition, the above decrease in the first A region is not limited to a monotonous decrease, and in the middle of the decrease, an increase within 50% of the difference between the average value of the values of $\{A_{Si}/(A_{Si}+A_{Ti})\}\times100$ and the maximum value within the first A region may be present.

In each first B region, from the point closest to the start point of the line analysis, the value of $\{A_{Si}/(A_{Si}+A_{Ti})\}\times100$ preferably decreases from the average value to the minimum value within the first B region and then increases to the average value, as the distance from the start point of the line analysis increases.

The above decrease in the first B region is not limited to a monotonous decrease, and in the middle of the decrease, an increase within 50% of the difference between the average value of the values of $\{A_{Si}/(A_{Si}+A_{Ti})\}\times100$ and the minimum value within the first B region may be present. In addition, the above increase in the first B region is not limited to a monotonous increase, and in the middle of the increase, a decrease within 50% of the difference between the average value of the values of $\{A_{Si}/(A_{Si}+A_{Ti})\}\times100$ and the minimum value within the first B region may be present.

For example, in FIG. 7, in a first A region in which the distance along the first direction from the start point of the line analysis is c1 or more and c2 or less, the value a1 of $\{A_{Si}/(A_{Si}+A_{Ti})\}\times100$ at P1 is the maximum value within the first A region. In the first A region, the value of $\{A_{Si}/(A_{Si}+A_{Ti})\}\times100$ increases from the average e1 to the maximum value a1 and then decreases from the maximum value a1 to the average value e1, as the distance along the first direction from the start point of the line analysis increases from c1 to c2. In FIG. 7, in a first B region in which the distance along the first direction from the start point of the line analysis is more than c2 and less than c3, the value b1 of $\{A_{Si}/(A_{Si}+A_{Ti})\}\times100$ at B1 is the minimum value within the first B region. In the first B region, the value of $\{A_{Si}/(A_{Si}+A_{Ti})\}\times100$ decreases from the average e1 to the minimum value b1 and then increases from the minimum value b1 to the average value e1, as the distance along the first direction from the start point of the line analysis increases from c2 to c3.

It has been confirmed that the effect of the present disclosure is exhibited as long as it is confirmed by the above method that the concentration of silicon in the hard particles periodically changes along the first direction set in the hard particles.

$$\{A_{Si}/(A_{Si}+A_{Ti})\}\times100)$$

In the hard particles of the present embodiment, the average of the percentage of the number of atoms of silicon, $A_{Si}$, to the sum of the number of atoms of titanium, $A_{Ti}$, and the number of atoms of silicon, $A_{Si}$, $\{A_{Si}/(A_{Si}+A_{Ti})\}\times100$, is preferably 1% or more and 20% or less.

According to this, the wear resistance and the breakage resistance of the cutting tool are further improved, and the tool life is further improved.

The average of $\{A_{Si}/(A_{Si}+A_{Ti})\}\times100$ is more preferably 1% or more and 10% or less, and further preferably 1% or more and 5% or less, from the viewpoint of improving the film hardness and the toughness.

As used herein, the term average of $\{A_{Si}/(A_{Si}+A_{Ti})\}\times100$ in the hard particles means the average of values of $\{A_{Si}/(A_{Si}+A_{Ti})\}\times100$ in a region in which line analysis has been carried out in the hard particles.

The maximum value of $\{A_{Si}/(A_{Si}+A_{Ti})\}\times100$ in the hard particles is preferably 1.5% or more and 40% or less more preferably 1.5% or more and 20% or less, and further preferably 1.5% or more and 10% or less, from the viewpoint of improving the film hardness and the toughness. As used herein, the "maximum value of $\{A_{Si}/(A_{Si}+A_{Ti})\}\times100$ in the hard particles" is a value calculated by the following method First, in each first A region present in the region in which line analysis has been carried out in the hard particles, the maximum value of $\{A_{Si}/(A_{Si}+A_{Ti})\}\times100$ in each first A region is measured. The average of the maximum value in each first A region corresponds to the "maximum value of the values of $\{A_{Si}/(A_{Si}+A_{Ti})\}\times100$ in the hard particles."

The minimum value of $\{A_{Si}/(A_{Si}+A_{Ti})\}\times100$ in the hard particles is preferably 0% or more and 1.5% or less, more preferably 0% or more and 1.0% or less, and further preferably 0% or more and 0.5% or less, from the viewpoint of improving the film hardness and the toughness. As used herein, the "minimum value of the value of $\{A_{Si}/(A_{Si}+A_{Ti})\}\times100$ in the hard particles" is a value calculated by the following method. First, in each first B region present in the region in which line analysis has been carried out in the hard particles, the minimum value of $\{A_{Si}/(A_{Si}+A_{Ti})\}\times100$ in the first B region is measured. The average of the minimum values in each first B region corresponds to the "minimum value of the value of $\{A_{Si}/(A_{Si}+A_{Ti})\}\times100$ in the hard particles."

The difference between the maximum value and the minimum value of $\{A_{Si}/(A_{Si}+A_{Ti})\}\times100$ is preferably 1% or more and 38% or less, more preferably 1% or more and 20% or less, and more preferably 1% or more and 8% or less, from the viewpoint of improving the film hardness and the toughness.

It has been confirmed that as long as the measurement is carried out on the same sample, even if the measurement is carried out a plurality of times by changing the measurement location of line analysis in the hard particles, there is little variation in the measurement results, and that even if the measurement location is arbitrarily set, it is not contrived.

(Average Period Width of Concentration of Silicon)

In the hard particles of the present embodiment, the concentration of silicon periodically changes along the first direction set in the hard particles. The average period width of the concentration of silicon is preferably 3 nm or more and 50 nm or less. According to this, the wear resistance and the breakage resistance are improved, and the tool life is improved. The lower limit of the period width of the concentration of silicon is preferably 3 nm or more, more preferably 4 nm or more, and further preferably 5 nm or more, from the viewpoint of improving the breakage resistance. The upper limit of the period width of the concentration of silicon is preferably 50 nm or less, more preferably 30 nm or less, and further preferably 10 nm or less, from the viewpoint of improving the wear resistance. The period width of the concentration of silicon is more preferably 4 nm or more and 30 nm or less, and further preferably 5 nm or more and 10 nm or less.

Herein, the method for measuring the period width of the concentration of silicon is as follows A lamination region is set by the same method as in (A1) to (A3) above. A Fourier transform is carried out on the lamination region to obtain a Fourier transform image. In the Fourier transform image, the periodicity within the lamination region appears as a spot. The period width is calculated by calculating the reciprocal of the distance between the spot and the center of the image showing the maximum intensity in the Fourier transform image.

It has been confirmed that as long as the measurement is carried out on the same sample, even if the measurement is carried out a plurality of times by changing the measurement location in a lamination region of the hard particles, there is little variation in the measurement results, and that even if the measurement location is arbitrarily set, it is not contrived.

The period width determined by the Fourier transform corresponds to the distance along the first direction between positions at which $\{A_{Si}/(A_{Si}+A_{Ti})\}\times100$ is the maximum value that are present within adjacent first A regions. The distance along the first direction between positions at which $\{A_{Si}/(A_{Si}+A_{Ti})\}\times100$ is the maximum value that are present within adjacent first A regions corresponds to a distance d1 between P1 and P2, a distance d2 between P2 and P3, a distance d3 between P3 and P4, a distance d4 between P4 and P5, a distance d5 between P5 and P6, or a distance d6 between P6 and P7, in FIG. 7.

(Particle Diameter of Hard Particles)

The particle diameter of the hard particles of the present embodiment is preferably, for example, 10 nm or more and 1000 nm or less. According to this, the hard particles can have excellent breakage resistance. The particle diameter of the hard particles is more preferably 10 nm or more and 700 nm or less, and further preferably 10 nm or more and 500 nm or less.

The method for measuring the particle diameter is as follows. A base material and a coating formed on the base material are worked with an FIB processing such that a cross section can be seen, and the cross section is observed with an FE-SEM (field emission scanning electron microscope). At that time, by observing the cross section as a backscattered electron image, portions having the same crystal orientation are observed with the same contrast, and these portions having the same contrast are regarded as one hard particle.

Next, a straight line having an arbitrary length (preferably corresponding to 400 µm) parallel to the base material surface is drawn at an arbitrary location of the hard particle layer on the image thus obtained. Then, the number of hard particles included in the straight line is measured, and the length of the straight line divided by the number of hard particles is defined as the particle diameter of the hard particles.

(Orientation of Hard Particle Layer)

In the present embodiment, the orientation of the hard particle layer is the (311) orientation. As used herein, the term "the orientation of the hard particle layer is the (311) orientation" means that the orientation index TC(311) of the (311) plane in the hard particle layer among the orientation index TC(hkl) defined by the following expression (1) is larger than the orientation indices of the other crystal orientation planes. Here, the other crystal orientation planes are the (111) plane, the (200) plane, the (220) plane, the (422) plane, the (331) plane, the (420) plane, and the (511) plane.

[Expression 1]

$$TC(hk1) = \frac{I(hk1)}{I_0(hk1)} \left\{ \frac{1}{8} \sum_{x,y,z} \frac{I(h_x k_y 1_z)}{I_0(h_x k_y 1_z)} \right\}^{-1} \quad (1)$$

In expression (1), f(hkl) and $I(h_x k_y 1_z)$ represent the measured diffraction intensity of the (hkl) plane and the measured diffraction intensity of the $(h_x k_y 1_z)$ plane, respectively, $I_0(hkl)$ and $I_0(h_x k_y 1_z)$ represent the average value of the powder diffraction intensity of TiC (card number: 32-1383) and TiN (card number: 38-1420) of the (hkl) plane according to the JPDS (Joint Committee on Powder Diffraction Standards) database and the average value of the powder diffraction intensity of TiC and TiN of the $(h_x k_y 1_z)$ plane according to the JCPDS database, respectively, and (hkl) and $(h_x k_y 1_z)$ each represent any of the 8 planes of the (111) plane, the (200) plane, the (220) plane, the (311) plane, the (331) plane, the (420) plane, the (422) plane, and the (511) plane.

The orientation index TC(311) of the hard particle layer of the present embodiment is preferably 3.5 or more, more preferably 5 or more, and further preferably 6 or more, from the viewpoint of improving the toughness and improving the breakage resistance particularly in steel cutting. The upper limit of the value of the orientation index TC(311) is not limited, and may be 8 or less because the number of reflection planes used in the calculation is 8. The value of the orientation index TC(311) is preferably 3.5 or more and 8 or less, more preferably 5 or more and 8 or less, and further preferably 6 or more and 8 or less.

The orientation index TC(311) is determined by X-ray diffraction measurement under the following conditions. Specifically, X-ray diffraction measurement (apparatus: SmartLab (registered trademark) manufactured by Rigaku Corporation) is carried out on one arbitrary location in the hard particle layer, and the orientation index of the (311) plane determined based on expression (1) above is defined as the orientation index TC(311) in the hard particle layer. In selecting the "one arbitrary location," any point that at first glance appears to be an abnormal value is excluded.

<<Conditions for X-Ray Diffraction Measurement>>

X-ray output: 45 kV, 200 mA

X-ray source: Cu-Kα radiation, 1.541862 Å

Detector: D/teX Ultra 250

Scan axis: 2θ/θ

Length limiting slit width: 2.0 mm

Scan mode: CONTINUOUS

Scan speed: 20°/min

It has been confirmed that as long as the measurement is carried out on the same sample, even if the measurement is carried out a plurality of times by changing the measurement location in the hard particle layer, there is little variation in the measurement results, and that even if the measurement location is arbitrarily set, it is not contrived.

<Different Layer>

Figure 2:
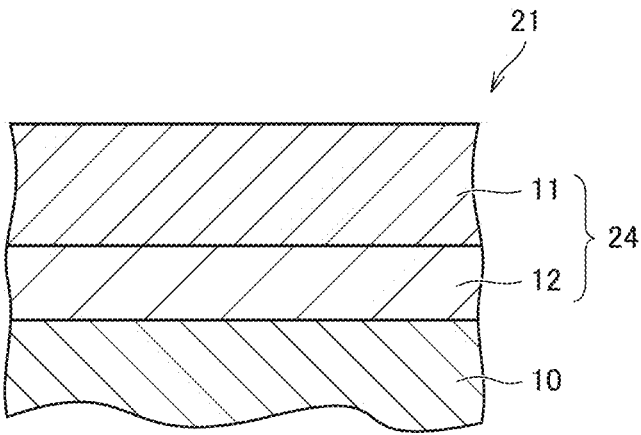
FIG. 2 is a schematic diagram showing a different example of the cross section of the cutting tool according to Embodiment 1.

The coating can include a different layer in addition to the hard particle layer, as described above. As shown in FIG. 2 to FIG. 4, examples of the different layer include a base layer 12 and an outermost layer 13

(Base Layer)

The base layer is disposed between the base material and the hard particle layer. Examples of the base layer include a TiN layer, a TiC layer, a TiCN layer, a TiBN layer, and an $Al_2O_3$ layer. By disposing a TiN layer, a TiC layer, a TiCN layer, or a TiBN layer directly on the base material as the base layer, the close adhesion between the base material and the coating can be enhanced. In addition, by using an $Al_2O_3$ layer as the base layer, the oxidation resistance of the coating can be enhanced. The average thickness of the base layer is preferably 0.1 μm or more and 20 μm or less. According to this, the coating can have excellent wear resistance and breakage resistance.

The base layer can consist of one layer. In addition, as shown in FIG. 4, base layer 12 can have a two-layer structure consisting of a first base layer 12A disposed on the base material side and a second base layer 12B disposed on the side opposite to the base material. When the base layer has a two-layer structure, it is preferable to combine a TiN layer and a TiCN layer. The TiCN layer has excellent wear resistance, and thus can impart more suitable wear resistance to the coating. The average thickness of the first base layer is preferably 0.1 μm or more and 20 μm or less, and more preferably 0.1 μm or more and 194 μm or less. The average thickness of the second base layer is preferably 1 μm or more and 20 μm or less, and further preferably 1 μm or more and 19.9 μm or less.

(Outermost Layer)

The outermost layer is a layer disposed closest to the surface of the coating. However, no outermost layer may be formed at a cutting edge ridgeline portion. The outermost layer is disposed directly on the hard particle layer when no different layer is formed on the hard particle layer. The outermost layer preferably includes any of carbide, nitride, or boride of Ti (titanium) as a main component. In addition, by using an $Al_2O_3$ layer as the outermost layer, the oxidation resistance of the coating can be enhanced.

The term "include any of carbide, nitride, or boride of Ti (titanium) as a main component" means including 90% by mass or more of any of carbide, nitride, or boride of Ti (titanium). In addition, the term means preferably being formed from any one of carbide, nitride, and boride of Ti except for an inevitable impurity.

Among any of carbide, nitride, and boride of Ti, it is particularly preferable to constitute the outermost layer by including nitride of Ti (that is, the compound represented by TiN) as a main component. Among these compounds, TiN has the clearest color (exhibits a gold color) and thus has the advantage of easy identification of a corner of the cutting insert after used for cutting (identification of a used site) The outermost layer preferably consists of a TiN layer.

The outermost layer preferably has an average thickness of 0.05 μm or more and 1 μm or less. According to this, the close adhesion between the outermost layer and an adjacent layer is improved.

Embodiment 2: Method for Manufacturing Cutting Tool

Figure 8:
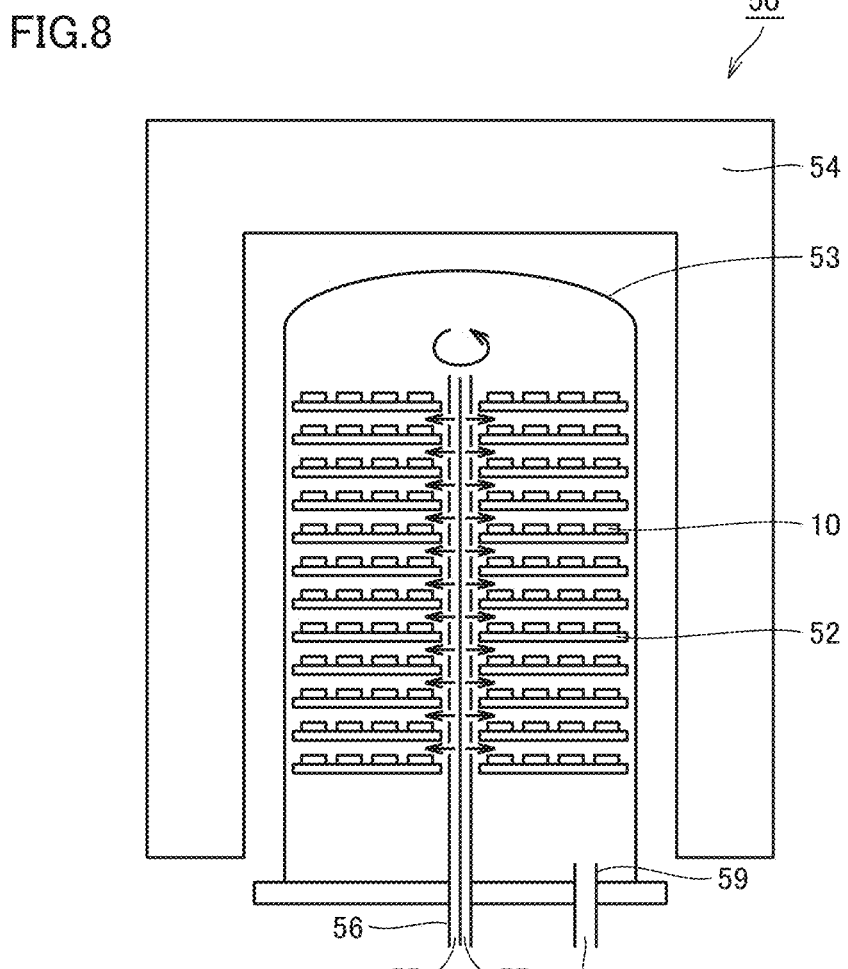
FIG. 8 is a schematic cross-sectional view of one example of a CVD apparatus used for manufacturing a cutting tool according to Embodiment 2.

One example of a method for manufacturing the cutting tool of the present embodiment will be described with reference to FIG. 8. FIG. 8 is a schematic cross-sectional view of one example of a CVD apparatus used for manufacturing the cutting tool of the present embodiment.

(Preparation of Base Material)

A base material is prepared. Details of the base material have been described above, and thus the description thereof will not be repeated.

(Formation of Coating)

Next, a coating is formed on the base material by using, for example, a CVD apparatus shown in FIG. 8. A plurality of base material setting jigs 52 holding base materials 10 can be installed in a CVD apparatus 50, and these are covered with a reaction vessel 53 made of a heat-resistant alloy steel. In addition, a temperature control apparatus 54 is disposed around reaction container 53, and the temperature in reaction container 53 can be controlled by temperature control apparatus 54.

An introduction pipe 56 having two introduction ports 55 and 57 is disposed in CVD apparatus 50. Introduction pipe 56 is disposed in such a way as to pass through a region in which base material setting jigs 52 are disposed, and a plurality of through holes are formed in a portion in the vicinity of base material setting jigs 52. In introduction pipe 56, the gases introduced into the pipe from introduction ports 55 and 57 are introduced into reaction vessel 53 through different through holes, respectively, without being mixed in introduction pipe 56. This introduction pipe 56 can rotate around the axis thereof as a central axis. In addition, an exhaust pipe 59 is disposed in CVD apparatus 50, and the exhaust gas can be discharged to the outside from an exhaust port 60 of exhaust pipe 59. The jigs and the like in reaction vessel 53 are usually constituted by graphite.

When the coating includes a base layer and/or an outermost layer, these layers can be formed by a conventionally known method.

The hard particle layer can be formed by using the above CVD apparatus by the following method. Specifically, a first raw material gas including Ti and Si is introduced from introduction port 55 into introduction pipe 56, and a second raw material gas including C and N is introduced from introduction port 57 into introduction pipe 56. The first raw material gas can include, for example, $Ti_4$ gas and $SiCl_4$ gas. The second raw material gas can include, for example, $CH_3CN$ gas. The first raw material gas and the second raw material gas can each include a carrier gas ($H_2$ gas, $N_2$ gas, Ar gas, or the like). Hereinafter, the first raw material gas and the second raw material gas in the reaction vessel is collectively referred to as the reaction gas.

A plurality of through holes are open on the upper side of introduction pipe 56 in the figure. The introduced first raw material gas (or first mixed gas consisting of the first raw material gas and a carrier gas) and second raw material gas (or second mixed gas consisting of the second raw material gas and a carrier gas) are ejected into reaction vessel 53 from different through holes, respectively. At this time, introduction pipe 56 rotates around the axis thereof as the center, as shown by the rotating arrow in the figure. Because of this, the first raw material gas (or first mixed gas) and the second raw material gas (or second mixed gas) are ejected as a mixed gas in which the both are uniformly mixed, toward the surface of base materials 10 set on base material setting jigs 52.

The total gas flow rate of the reaction gas during the formation of the hard particle layer can be, for example, 10 to 80 L/min. Here, the term "total gas flow rate" refers to the total volume flow rate introduced into a CVD furnace per unit time, assuming that a gas under the standard conditions (0° C. 1 atm) is an ideal gas.

The proportions of $TiCl_4$ gas and $CH_3CN$ gas in the reaction gas are always constant during the formation of the hard particle layer. The proportion of $TiCl_4$ gas in the reaction gas can be, for example, 0.35 to 1.30% by volume. The proportion of $CH_3CN$ gas in the reaction gas can be, for example, 0.63 to 0.85% by volume. Because of the above total gas flow rate and the above proportion of $CH_3CN$ gas, the orientation of the hard particle layer becomes the (311) orientation. The $CH_3CN$ gas flow rate obtained by the above total gas flow rate and the above proportion of $CH_3CN$ gas is more than the $CH_3CN$ gas flow rate adopted in the conventional formation of a TiSiCN layer.

The proportion of $SiCl_4$ gas in the reaction gas is changed periodically by regulating the amount of $SiCl_4$ gas introduced Specifically, when the length of 1 period of change in the amount of $SiCl_4$ gas introduced is t (seconds), and the range of change in the proportion of $SiCl_4$ gas in the reaction gas is r1 (% by volume) to r2 (% by volume), the amount of $SiCl_4$ gas introduced is regulated such that the proportion of $SiCl_4$ gas gradually increases from r1 (% by volume) to r2 (% by volume) from the start of film formation to the middle time point (t/2 (seconds)) of 1 period, and subsequently, the proportion of $SiCl_4$ gas gradually decreases from r2 (% by volume) to r1 (% by volume) from the middle time point (t/2 (seconds)) to the final time point (t (seconds)) of 1 period. This is defined as 1 period, and the period is repeated until the hard particle layer reaches the desired thickness. The proportion of a carrier gas (for example, $H_2$ gas) in the reaction gas is changed such that the total gas flow rate remains constant in response to a change in the proportion of $SiCl_4$ gas. By adjusting the length t (seconds) of the 1 period, the period width (nm) of the concentration of silicon in the hard particles can be controlled. The value of $A_{Si}/(A_{Si}+A_{Ti})$ in the hard particles can be controlled by adjusting the minimum value r1 and the maximum value r2 of the range of the proportion of $SiCl_4$ gas in the reaction gas.

In the present step, the temperature of base material 10 is preferably in the range of 750 to 900° C. and the pressure in reaction vessel 53 is preferably in the range of 0.1 to 13 kPa. The thickness of the hard particle layer can be controlled by regulating the flow rates of the raw material gases and the film formation time.

Next, base material 10 with a coating formed thereon is cooled. The cooling rate does not exceed, for example, 5° C./min, and the cooling rate slows as the temperature of base material 10 decreases.

In addition to the above steps, a heat treatment step such as annealing or a surface treatment step such as surface grinding or shot blasting can be carried out.

The cutting tool of Embodiment 1 can be obtained by the manufacturing method described above.

[Supplementary Note 1]

In the cutting tool of the present disclosure, the orientation index TC(311) in the hard particle layer is preferably 3.5 or more, more preferably 5 or more: and further preferably 6 or more.

EXAMPLES

The present embodiment will be described more specifically with reference to Examples. However, the present embodiment is not limited by these Examples.

<Preparation of Base Material>

Base material K, base material L, and base material M shown in Table 1 below were prepared. Specifically, first, raw material powders having the blending compositions (% by mass) shown in Table 1 were uniformly mixed to obtain mixed powders, respectively. "Balance" in Table 1 shows that WC accounts for the balance of the blending composition (% by mass). Next, the mixed powders were pressure-molded into the shape of CNMG120408 (indexable cutting insert manufactured by Sumitomo Electric Hardmetal Corp.), and then sintered at 1300 to 1500° C. for 1 to 2 hours to obtain base material K, base material L, and base material M made of a cemented carbide. Base material K, base material L, and base material M all have a base material shape of CNMG120408.

TABLE 1

| Type | | Co | $Cr_3C_2$ | NbC | TaC | WC |
|---|---|---|---|---|---|---|
| | | Blending composition (% by mass) | | | | |
| Base material | K | 6.0 | 0.4 | 3 | 2.0 | Balance |
| | L | 8.0 | 0.4 | 3 | 2.0 | Balance |
| | M | 11.0 | 0.4 | 3 | 2.0 | Balance |

<Formation of Coating>

A coating was formed on the surface of base material K, base material L, or base material M obtained above Specifically, by using the CVD apparatus shown in FIG. 8, the base material was set in base material setting jigs, and a thermal CVD method was carried out to form a coating on the base material. The configuration of the coating of each sample is shown in Table 2.

layer and exposed to the outside. In addition, the descriptions of the compounds in the Base layer column and the Outermost layer column of Table 2 are the compounds constituting the base layer and the outermost layer in Table 2, respectively, and the value in parentheses to the right of each compound shows the layer thickness. In addition, when two compounds (for example, "TiN (0.5)-TiCN (2.3)") are described in one cell of Table 2, the compound on the left side ("TiN (0.5)") means a compound constituting the layer located on the side closer to the base material, the compound on the right side ("TiCN (2.3)") means a compound constituting the layer located on the side farther from the base material, and the values in parentheses show the thickness of the layers, respectively. The descriptions of a to p and w to z in the Hard particle layer in Table 2 show that the layers are formed under formation condition a to formation condition p and formation condition w to formation condition z in Table 4, respectively, and the values in parentheses mean the thickness of the layers, respectively. In addition, a cell shown by "-" in Table 2 means that no layer is present.

For example, the cutting tool of sample 1 in Table 2 means a cutting tool wherein a TiN layer having a thickness of 0.5 μm and a TiCN layer having a thickness of 2.3 μm are laminated in presented order directly on the surface of base material L to form a base layer, a hard particle layer having a thickness of 5.0 m formed under formation condition a

TABLE 2

| Sample No. | Type of base material | Base layer (μm) | Hard particle layer (μm) | Outermost layer (μm) | Thickness of entire coating (μm) |
|---|---|---|---|---|---|
| | | Configuration of coating and thickness of each layer | | | Thickness |
| 1 | L | TiN(0.5)—TiCN(2.3) | a (5.0) | — | 7.8 |
| 2 | L | TiN(0.5)—TiCN(2.3) | b (5.2) | TiN(0.5) | 8.5 |
| 3 | L | TiN(0.5)—TiCN(2.2) | c (5.2) | — | 7.9 |
| 4 | L | TiN(0.5)—TiCN(2.3) | d (7.3) | — | 10.1 |
| 5 | L | TiN(0.5)—TiCN(2.3) | e (5.1) | — | 7.9 |
| 6 | L | TiN(0.5)—TiCN(2.3) | f (4.8) | — | 7.6 |
| 7 | L | TiN(0.5)—TiCN(2.6) | g (3.9) | TiN(0.5) | 7.5 |
| 8 | L | TiN(0.5)—TiCN(2.3) | h (5.1) | — | 7.9 |
| 9 | L | TiN(0.5)—TiCN(2.3) | i (5.0) | — | 7.8 |
| 10 | L | TiN(0.5)—TiCN(2.3) | j (7.0) | — | 9.8 |
| 11 | L | TiN(0.5)—TiCN(2.3) | k (5.1) | — | 7.9 |
| 12 | L | TiN(0.5)—TiCN(2.8) | l (5.3) | — | 8.6 |
| 13 | K | TiN(0.5)—TiCN(2.3) | a (5.2) | — | 8.0 |
| 14 | M | TiN(0.5)—TiCN(2.6) | a (5.3) | — | 8.4 |
| 15 | L | TiN(0.5)—TiCN(2.3) | a (8.3) | — | 11.1 |
| 16 | L | TiN(0.5)—TiCN(2.3) | a (3.0) | — | 5.8 |
| 17 | L | TiN(0.5)—TiCN(2.3) | a (5.0) | TiCNO(0.3)—$Al_2O_3$(3.1) | 11.1 |
| 18 | L | TiN(0.5) | a (7.4) | — | 7.9 |
| 19 | L | — | a (0.5) | — | 0.5 |
| 20 | L | — | a (1.0) | — | 1.0 |
| 21 | L | — | a (10.0) | — | 10.0 |
| 22 | L | — | a (20.0) | — | 20.0 |
| 23 | L | — | a (25.0) | — | 25.0 |
| 24 | L | TiN(0.5)—TiCN(2.5) | m (4.9) | — | 7.9 |
| 25 | L | TiN(0.5)—TiCN(2.5) | n (4.9) | — | 7.9 |
| 26 | L | TiN(0.5)—TiCN(2.5) | o (4.7) | — | 7.7 |
| 27 | L | TiN(0.5)—TiCN(2.5) | p (7.0) | — | 10.0 |
| 1-1 | L | TiN(0.5)—TiCN(2.1) | w (5.2) | — | 7.8 |
| 1-2 | L | TiN(0.5)—TiCN(2.2) | x (3.1) | — | 5.8 |
| 1-3 | L | TiN(0.4)—TiCN(2.2) | y (5.0) | — | 7.6 |
| 1-4 | L | TiN(0.5)—TiCN(2.3) | z (5.2) | — | 8.0 |
| 1-5 | L | TiN(0.5)—TiCN(2.3) | y (5.2) | TiCNO(0.3)—$Al_2O_3$(3.2) | 11.5 |

In Table 2, the base layer is a layer that is in direct contact with the surface of the base material, the hard particle layer is a layer formed directly on the base layer, and the outermost layer is a layer formed directly on the hard particle described later is formed directly on the base layer, and the thickness of the entire coating is 7.8 μm. In sample 1, no outermost layer was formed directly on the hard particle layer.

The base layer and the outermost layer shown in Table 2 are layers formed by a conventionally known CVD method, and the formation conditions therefor are as shown in Table 3. For example, the row of "TiN (base layer)" in Table 3 shows the conditions for forming a TiN layer as the base layer. The description of TiN (base layer) in Table 3 means that a base material is disposed in a reaction vessel of the CVD apparatus (pressure in reaction vessel of 6.7 kPa), the base material is heated to a base material temperature of 915° C., and a mixed gas consisting of 2.0% by volume of $TiCl_4$ gas, 39.7% by volume of $N_2$ gas, and a balance (58.3% by volume) of FH gas is ejected at a flow rate of 63.8 L/min into the reaction vessel to form the TiN layer. The thickness of each layer was controlled by the time during which each reaction gas was ejected.

is regulated such that the proportion of $SiCl_4$ gas gradually increases to the maximum value shown in the "Range" column from the start of film formation to the middle time point (($1/2$) period (seconds)) of the time (seconds) shown in the "Period" column of Table 4, and subsequently, the proportion of $SiCl_4$ gas gradually decreases to the minimum value shown in the "Range" column from the middle time point (($1/2$) period (seconds)) to the final time point of 1 period (1 period (seconds)) This is defined as 1 period, and the period is repeated until the hard particle layer reaches the desired thickness. The proportion of Hz gas is changed such that the total gas flow rate remains constant in response to a change in the proportion of $SiCl_4$ gas.

For example, under formation condition a, the total gas flow rate of the reaction gas is 600 L/min. The proportion of

TABLE 3

| Configuration of coating Composition | Formation conditions Reaction gas composition (% by volume) | Reaction atmosphere | | |
|---|---|---|---|---|
| | | Pressure in reaction vessel | Base material temperature | Total gas flow rate (L/min) |
| TiN (base layer) | $TiCl_4$ = 2.0, $N_2$ = 39.7, $H_2$ = balance | 6.7 | 915 | 63.8 |
| TiN (outermost layer) | $TiCl_4$ = 0.5, $N_2$ = 41.2, $H_2$ = balance | 79.8 | 980 | 45.9 |
| TiCN | $TiCl_4$ = 2.0, $CH_2CN$ = 0.7, $H_2$ = balance | 9.0 | 860 | 50.5 |
| TiCNO | $TiCl_4$ = 2.1, CO = 3.2, $CH_4$ = 2.8, $N_2$ = 23.7, $H_2$ = balance | 16.0 | 1030 | 70.5 |
| $Al_2O_3$ | $AlCl_3$ = 1.6, $CO_2$ = 4.5, $H_2S$ = 0.2, HCl = 3.5, $H_2$ = balance | 6.7 | 1000 | 46.2 |

The hard particle layers shown in Table 2 are each formed under any condition of formation condition a to formation condition p and formation condition w to formation condition z shown in Table 4.

(Formation Condition a to Formation Condition p, and Formation Condition z)

Under formation condition a to formation condition p and formation condition z, first, the pressure in the reaction vessel of the CVD apparatus is set to the pressure shown in the "Pressure in reaction vessel (kPa)" column of Table 4, and the base material temperature is set to the temperature shown in the "Base material temperature (° C.)" column of Table 4. For example, under formation condition a, the pressure in the reaction vessel of the CVD apparatus is set to 9.0 kPa, and the base material temperature is set to 850° C.

Next, a reaction gas including the components shown in the "Reaction gas composition" column of Table 4 is introduced into the reaction vessel to form a hard particle layer (TiSiCN layer) on the base material. The total gas flow rate of the reaction gas is as shown in the "Total gas flow rate (L/min)" column of Table 4. The term "total gas flow rate" refers to the total volume flow rate introduced into a CVD furnace per unit time, assuming that a gas under the standard conditions (0° C., 1 atm) is an ideal gas.

The proportions of $TiCl_4$ gas, $CH_3CN$ gas and $N_2$ gas in the reaction gas are always constant during the formation of the hard particle layer. The proportion of $SiCl_4$ gas in the reaction gas is changed in the range of the proportion (% by volume) shown in the "Range" column, with the time (seconds) shown in the "Period" column of "$SiCl_4$" in Table 4 as 1 period. Specifically, the proportion of $SiCl_4$ gas at the start of film formation is set to the minimum value shown in the "Range" column, and the amount of $SiCl_4$ gas introduced $TiCl_4$ gas in the reaction gas is 0.70% by volume, the proportion of $CH_3CN$ gas is 0.75% by volume, the proportion of $N_2$ gas is 8.90% by volume, and the proportions of these gases are constant during the formation of the particle layer. The ratio of $SiCl_4$ gas in the reaction gas is changed in the range of 0.1 to 1.7% by volume with 7 seconds as 1 period. More specifically, the proportion of $SiCl_4$ gas at the start of film formation is set to 0.1% by volume, and the amount of $SiCl_4$ gas introduced is regulated such that the proportion of $SiCl_4$ gas gradually increases from 0.1% by volume to 1.7% by volume from the start of film formation to 3.5 seconds thereafter, and subsequently, the proportion of $SiCl_4$ gas gradually decreases from 1.7% by volume to 0.1% by volume from 3.5 seconds to 7 seconds after the start of film formation. This is defined as 1 period, and the period is repeated until the thickness of the hard particle layer reaches the thickness shown in the "Hard particle layer" column of Table 2. The volume proportion of $H_2$ gas is changed such that the total gas flow rate remains constant in response to a change in the proportion of $SiCl_4$ gas. Under formation condition a, the average of the proportion of $SiCl_4$ gas in the reaction gas is 0.90% by volume.

After that, the base material is cooled at a cooling rate of 5° C./min.

(Formation Condition W)

Formation condition w is a condition for the conventional formation of a TiCN layer. Specifically, first, the pressure in the reaction vessel of the CVD apparatus is set to 9.0 kPa, and the base material temperature is set to 850° C.

Next, a reaction gas including the components shown in the "Reaction gas composition (% by volume)" column of Table 4 ($TiCl_4$: 2.00% by volume, $CH_3CN$: 0.75% by volume, $H_2$ gas; the balance) is introduced into the reaction vessel to form a TiCN layer (hard particle layer) on the base material. The composition of the reaction gas is constant during film formation. The total gas flow rate of the reaction gas is 60.0 L/min. After that, the base material is cooled at a cooling rate of 5° C./min.

(Formation Condition X)

Formation condition x is a condition for forming a hard particle layer (TiSiCN layer) by using the PVD method disclosed in PTL 1.

(Formation Condition Y)

Formation condition y is a condition for forming a hard particle layer (TiSiCN layer) by using the CVD method disclosed in PTL 2.

According to the above, cutting tools of sample 1 to sample 27 (corresponding to Examples) and sample 1-1 to sample 1-5 (corresponding to Comparative Examples) were obtained.

specific measurement method is as described in Embodiment 1, and thus the description thereof will not be repeated. Results thereof are shown in the "Maximum $\{A_{Si}/(A_{Si}+A_{Ti})\}\times100(\%)$," "Minimum $\{A_{Si}/(A_{Si}+A_{Ti})\}\times100(\%)$," and "Average $\{A_{Si}/(A_{Si}+A_{Ti})\}\times100(\%)$" columns of Table 5. The notation of "-" shows that no measurement was carried out.

(Period Width of Concentration of Silicon)

For the hard particles obtained under each formation condition, the average period width of the concentration of silicon in the first direction set in the hard particles was measured. A specific measurement method is as described in Embodiment 1, and thus the description thereof will not be repeated Results thereof are shown in the "Average period width (nm)" column of Table 5 The notation of "-" shows that no measurement was carried out.

TABLE 4

| | | Base material temperature (° C.) | Pressure in reaction vessel (kPa) | Total gas flow rate (L/min) | Reaction gas composition | | | | | | |
| | | | | | | SiCl₄ | | | | | |
| Formation condition | Formation method | | | | TiCl₄ % by volume | Average % by volume | Range % by volume | Period sec | CH₃CN % by volume | N₂ % by volume | H₂ % by volume |
|---|---|---|---|---|---|---|---|---|---|---|---|
| a | CVD | 850 | 9.0 | 60.0 | 0.70 | 0.90 | 0.1-1.7 | 7 | 0.75 | 8.90 | Balance |
| b | CVD | 850 | 9.0 | 60.0 | 1.00 | 0.60 | 0.1-1.1 | 7 | 0.75 | 8.90 | Balance |
| c | CVD | 850 | 9.0 | 60.0 | 0.80 | 0.80 | 0.1-1.5 | 7 | 0.75 | 8.90 | Balance |
| d | CVD | 850 | 9.0 | 60.0 | 0.60 | 1.00 | 0.1-1.9 | 7 | 0.75 | 8.90 | Balance |
| e | CVD | 850 | 9.0 | 60.0 | 0.40 | 1.20 | 0.1-2.3 | 7 | 0.75 | 8.90 | Balance |
| f | CVD | 850 | 9.0 | 60.0 | 0.70 | 0.90 | 0.1-1.7 | 3 | 0.75 | 8.90 | Balance |
| g | CVD | 830 | 9.0 | 55.0 | 0.70 | 0.90 | 0.1-1.7 | 7 | 0.75 | 8.90 | Balance |
| h | CVD | 900 | 9.0 | 73.0 | 0.70 | 0.90 | 0.1-1.7 | 7 | 0.75 | 8.90 | Balance |
| i | CVD | 850 | 9.0 | 60.0 | 0.70 | 0.90 | 0.1-1.7 | 30 | 0.75 | 8.90 | Balance |
| j | CVD | 850 | 9.0 | 60.0 | 0.70 | 0.90 | 0.1-4 7 | 60 | 0.75 | 8.90 | Balance |
| k | CVD | 850 | 9.0 | 60.0 | 0.70 | 0.90 | 0.1-1.7 | 7 | 0.63 | 8.90 | Balanca |
| l | CVD | 850 | 9.0 | 60.0 | 0.70 | 0.90 | 0.1-1.7 | 7 | 0.83 | 8.90 | Balance |
| m | CVD | 850 | 9.0 | 60.0 | 1.30 | 0.30 | 0-0.6 | 7 | 0.75 | 8.90 | Balance |
| n | CVD | 850 | 9.0 | 60.0 | 0.35 | 1.25 | 0.1-2.4 | 7 | 0.75 | 8.90 | Balance |
| o | CVD | 850 | 9.0 | 60.0 | 0.70 | 0.90 | 0.1-1.7 | 2 | 0.75 | 8.90 | Balance |
| p | CVD | 850 | 9.0 | 60.0 | 0.70 | 0.90 | 0.1-1.7 | 66 | 0.75 | 8.90 | Balance |
| w | CVD | 850 | 9.0 | 60.0 | 2.00 | — | — | — | 0.75 | — | Balance |
| x | PVD | — | — | — | — | — | — | — | — | — | — |
| y | CVD | 800 | 6.0 | 10.5 | 8.00 | 38.00 | Constant | — | 32.00 | — | Balance |
| z | CVD | 850 | 9.0 | 60.0 | 0.70 | 0.90 | 0.1-1.7 | 7 | 0.60 | 8.90 | Balance |

<Characteristics of Hard Particle Layer>

(Configuration of Hard Particle Layer)

It was confirmed that the hard particle layers obtained under formation condition a to formation condition p and formation condition z are formed from a plurality of hard particles formed from TiSiCN, and that the concentration of silicon periodically changes along the first direction set in the hard particles. A specific confirmation method is described in Embodiment 1, and thus the description thereof will not be repeated.

When the hard particle (TiCN) layer obtained under formation condition w was observed with a bright-field scanning transmission electron microscope (BF-STEM), the layer had a uniform structure, and no periodic change was confirmed.

When the hard particle layers obtained under formation condition x and formation condition y were observed with a bright-field scanning transmission electron microscope (BF-STEM), a nanocomposite structure was confirmed. The hard particle layers had the (200) orientation.

($\{A_{Si}/(A_{Si}+A_{Ti})\}\times100$)

For the hard particles obtained under each formation condition, the maximum value, the minimum value, and the average value of $\{A_{Si}/(A_{Si}+A_{Ti})\}\times100$ were measured. A (Orientation)

The orientation of the hard particle layer obtained under each formation condition was measured. A specific method for measuring the orientation of the hard particle layer is described in Embodiment 1, and thus the description thereof will not be repeated. In each hard particle layer, among the orientation indices TC(hkl), the orientation plane having the largest orientation index is shown in the "Orientation plane" column of Table 5, and the orientation index TC(hkl) of the orientation plane is shown in the "Orientation index TC(hkl) of orientation plane" column.

In the hard particle layers obtained under formation condition a to formation condition p and formation condition w, the orientation index TC(311) of the (311) plane was the largest. Therefore, the orientation of each of the hard particle layers obtained under formation condition a to formation condition p and formation condition w was the (311) orientation. For example, the orientation index TC(311) of the hard particle layer obtained under formation condition a was 4.1.

In the hard particle layers obtained under formation condition x to formation condition z, the orientation index TC(200) of the (200) plane was the largest. Therefore, the orientation of each of the hard particle layers obtained under formation condition x to formation condition z was the (200) orientation.

TABLE 5

| Formation condition | Maximum $\{A_{Si}/(A_{Si} + A_{Ti})\} \times 100$ (%) | Minimum $\{A_{Si}/(A_{Si} + A_{Ti})\} \times 100$ (%) | Average $\{A_{Si}/(A_{Si} + A_{Ti})\} \times 100$ (%) | Average period width (nm) | Orientation plane | Orientation index TC(hkl) of orientation plane |
|---|---|---|---|---|---|---|
| | | | Characteristics of hard particle layer | | | |
| a | 8.5 | 0.7 | 4.6 | 6.3 | (311) plane | 4.1 |
| b | 2.0 | 0.5 | 1.0 | 6.4 | (311) plane | 4.1 |
| c | 4.2 | 1.0 | 2.6 | 6.2 | (311) plane | 4.2 |
| d | 18.5 | 1.0 | 9.8 | 6.5 | (311) plane | 4.1 |
| e | 38.2 | 1.1 | 20.0 | 6.4 | (311) plane | 4.2 |
| f | 8.3 | 1.0 | 4.6 | 3.0 | (311) plane | 4.1 |
| g | 8.4 | 1.0 | 4.7 | 4.2 | (311) plane | 4.5 |
| h | 8.4 | 1.1 | 4.8 | 9.5 | (311) plane | 3.6 |
| i | 8.4 | 1.0 | 4.7 | 31.5 | (311) plane | 4.1 |
| j | 8.2 | 0.9 | 4.5 | 50.0 | (311) plane | 4.1 |
| k | 8.3 | 1.0 | 4.7 | 6.3 | (311) plane | 3.2 |
| l | 8.2 | 1.0 | 4.6 | 6.3 | (311) plane | 5.4 |
| m | 1.0 | 0 | 0.5 | 6.4 | (311) plane | 4.1 |
| n | 48.8 | 1.2 | 25.0 | 6.4 | (311) plane | 4.1 |
| o | 8.3 | 1.0 | 4.6 | 2.5 | (311) plane | 4.1 |
| p | 8.2 | 0.9 | 4.5 | 55.0 | (311) plane | 4.1 |
| w | — | — | — | — | (311) plane | 4.5 |
| x | — | — | 20.0 | — | (200) plane | 5.0 |
| y | — | — | 24.2 | — | (200) plane | 3.5 |
| z | 8.2 | 1.0 | 4.6 | 6.0 | (200) plane | 4.5 |

<Cutting Test 1>

By using the cutting tools of sample 1 to sample 27 and sample 1-1 to sample 1-5, continuous cutting of steel (SCM435) was carried out under the following cutting conditions, and the cutting time until the amount of flank wear (Vb) reached 0.3 mm was measured. A longer cutting time shows better wear resistance and a longer tool life. In addition, the final damage morphology of the cutting edge was observed. In the final damage morphology, the term "normal wear" means a damage morphology consisting only of wear without causing chipping, fracture, or the like (having a smooth worn face) and shows excellent breakage resistance. Results thereof are shown in Table 6.

<Cutting Conditions>

Work material: SCM435 round bar peripheral cutting
Peripheral speed: 250 m/min
Feed rate: 0.15 mm/rev
Cutting depth: 1.0 mm
Cutting fluid: Yes

TABLE 6

| Sample No. | Cutting time (min) | Final damage morphology |
|---|---|---|
| 1 | 52 | Normal wear |
| 2 | 52 | Normal wear |
| 3 | 52 | Normal wear |
| 4 | 56 | Normal wear |
| 5 | 47 | Normal wear |
| 6 | 52 | Normal wear |
| 7 | 52 | Normal wear |
| 8 | 52 | Normal wear |
| 9 | 46 | Normal wear |
| 10 | 44 | Normal wear |
| 11 | 52 | Normal wear |
| 12 | 52 | Normal wear |
| 13 | 60 | Normal wear |
| 14 | 46 | Normal wear |
| 15 | 72 | Normal wear |
| 16 | 44 | Normal wear |
| 17 | 65 | Normal wear |
| 18 | 56 | Normal wear |
| 19 | 43 | Normal wear |
| 20 | 44 | Normal wear |
| 21 | 65 | Normal wear |
| 22 | 70 | Normal wear |

TABLE 6-continued

| Sample No. | Cutting time (min) | Final damage morphology |
|---|---|---|
| 23 | 75 | Normal wear |
| 24 | 44 | Normal wear |
| 25 | 44 | Normal wear |
| 26 | 50 | Normal wear |
| 27 | 50 | Normal wear |
| 1-1 | 23 | Normal wear |
| 1-2 | 20 | Normal wear |
| 1-3 | 39 | Normal wear |
| 1-4 | 39 | Normal wear |
| 1-5 | 41 | Normal wear |

(Evaluation 1)

It was confirmed that sample 1 to sample 27 (Examples) had better wear resistance in continuous steel cutting and a longer tool life than sample 1-1 to sample 1-5 (Comparative Examples). In addition, it was confirmed that sample 1 to sample 27 had normal wear as the final damage morphology and maintained excellent breakage resistance equivalent to that of the conventional hard particle layers (sample 1-1 to sample 1-5).

<Cutting Test 2>

By using the cutting tools of sample 1 to sample 27 and sample 1-1 to sample 1-5, interrupted cutting of steel was carried out under the following cutting conditions, and the number of impacts until the cutting tool was broken was measured to evaluate the breakage resistance of the cutting tools Here, the term breakage means a breakage of 300 μm or more. A larger number of impacts until breakage shows better breakage resistance. Results thereof are shown in Table 7. In Table 7, "No breakage" means that although cutting was carried out up to a number of impacts of 5000, no breakage occurred <Cutting Conditions>

Work material: SCM435 plate material peripheral cutting
Peripheral speed: 250 m/min
Feed rate: 0.2 mm/rev
Cutting depth: 1.0 mm
Cutting fluid: Yes

[Table 7]

TABLE 7

| Sample No. | Number of impacts (times) |
|---|---|
| 1 | No breakage |
| 2 | No breakage |
| 3 | No breakage |
| 4 | No breakage |
| 5 | No breakage |
| 6 | No breakage |
| 7 | No breakage |
| 8 | No breakage |
| 9 | No breakage |
| 10 | No breakage |
| 11 | No breakage |
| 12 | No breakage |
| 13 | No breakage |
| 14 | No breakage |
| 15 | No breakage |
| 16 | No breakage |
| 17 | No breakage |
| 18 | No breakage |
| 19 | No breakage |
| 20 | No breakage. |
| 21 | No breakage |
| 22 | No breakage |
| 23 | No breakage |
| 24 | No breakage |
| 25 | No breakage |
| 26 | No breakage |
| 27 | No breakage |
| 1-1 | 1701 |
| 1-2 | 2180 |
| 1-3 | 2995 |
| 1-4 | 3064 |
| 1-5 | 2811 |

(Evaluation 2)

It was confirmed that sample 1 to sample 27 (Examples) had better breakage resistance in interrupted steel cutting and a longer tool life than sample 1-1 to sample 1-5 (Comparative Examples).

The embodiments and Examples of the present disclosure have been described as above, and it is also planned from the beginning to appropriately combine the configurations of the embodiments and Examples described above and to modify these in various ways.

The embodiments and the Examples disclosed this time should be considered to be illustrative in all respects and non-limiting. The scope of the present invention is defined by the Claims, not by the above embodiments and Examples, and is intended to include all modifications within the meaning and scope equivalent to the Claims.

REFERENCE SIGNS LIST

1, 21, 31, 41 Cutting tool, 10 Base material, 11 Hard particle layer, 12, 12A, 12B Base layer, 13 Outermost layer, 14, 24, 34, 45 Coating, 50 CVD apparatus, 52 Base material setting jig, 53 Reaction vessel, 54 Temperature control apparatus, 55, 57 Introduction port, 56 Introduction pipe, 59 Exhaust pipe, 60 Exhaust port

The invention claimed is:

1. A cutting tool comprising a base material and a coating disposed on the base material, wherein the coating comprises a hard particle layer, the hard particle layer is formed from a plurality of hard particles including titanium, silicon, carbon, and nitrogen, in the hard particles, a concentration of the silicon periodically changes along a first direction set in the hard particles, an orientation of the hard particle layer is a (311) orientation, and the orientation of the hard particle layer that is the (311) orientation means that an orientation index TC(311) of a (311) plane in the hard particle layer among an orientation index TC(hkl) defined by an expression (1)

$$TC(hkl) = \frac{I(hk1)}{I_0(hk1)}\left\{\frac{1}{8}\sum_{x,y,z}\frac{I(h_xk_y1_z)}{I_0(h_xk_y1_z)}\right\}^{-1} \tag{1}$$

is larger than respective orientation indices of a (111) plane, a (200) plane, a (220) plane, a (422) plane, a (331) plane, a (420) plane, and a (511) plane, where I(hkl) and I(hxkylz) represent a measured diffraction intensity of a (hkl) plane and a measured diffraction intensity of a (hxkylz) plane, respectively, I0(hkl) and I0(hxkylz) represent an average value of a powder diffraction intensity of TiC (card number: 32-1383) and TiN (card number: 38-1420) of the (hkl) plane according to JCPDS (Joint Committee on Powder Diffraction Standards) database and an average value of a powder diffraction intensity of TiC and TiN of the (hxkylz) plane according to the JCPDS database, respectively, and (hkl) and (hxkylz) each represent any of 8 planes of the (111) plane the (200) plane, the (220) plane, the (311) plane, the (331) plane, the (420) plane, the (422) plane, and the (511) plane.

2. The cutting tool according to claim 1, wherein in the hard particles, an average of a percentage of the number of atoms of the silicon, $A_{Si}$, to a sum of the number of atoms of the titanium, $A_{Ti}$, and the number of atoms of the silicon, $A_{Si}$, $\{A_{Si}/(A_{Si}+A_{Ti})\}\times100$, is 1% or more and 20% or less.

3. The cutting tool according to claim 2, wherein the average of $\{A_{Si}/(A_{Si}+A_{Ti})\}\times100$ is 1% or more and 10% or less.

4. The cutting tool according to claim 1, wherein an average period width of the concentration of the silicon is 3 nm or more and 50 nm or less.

5. The cutting tool according to claim 4, wherein the average period width of the concentration of the silicon is 4 nm or more and 30 nm or less.

6. The cutting tool according to claim 1, wherein a thickness of the hard particle layer is 1 μm or more and 20 μm or less.

7. The cutting tool according to claim 1, wherein the base material is formed from a cemented carbide including tungsten carbide and cobalt, and a content of the cobalt in the cemented carbide is 6% by mass or more and 11% by mass or less.

8. The cutting tool according to claim 1, wherein in the hard particles, a difference between a maximum value and a minimum value of a percentage of the number of atoms of the silicon, $A_{Si}$, to a sum of the number of atoms of the titanium, $A_{Ti}$, and the number of atoms of the silicon, $A_{Si}$, $\{A_{Si}/(A_{Si}+A_{Ti})\}\times100$, is 1% or more and 38% or less.

9. The cutting tool according to claim 1, wherein a value of an orientation index TC(311) of the hard particle layer is 3.5 or more and 8 or less.

10. The cutting tool according to claim 1, wherein the coating comprises a base layer disposed directly on the base material, and the base layer consists of at least one selected from the group consisting of a TIN layer, a TiC layer, a TiCN layer, a TiBN layer, and an $Al_2O_3$ layer.

11. The cutting tool according to claim 1, wherein the coating comprises an outermost layer disposed closest to the surface of the coating, and the outermost layer consists of a layer including 90% by mass or more of titanium carbide, titanium nitride, or titanium boride, or an $Al_2O_3$ layer.

12. The cutting tool according to claim 1, wherein a thickness of the entire coating is 1 μm or more and 30 μm or less.

13. The cutting tool according to claim 1, wherein in the hard particles, a maximum value of a percentage of the number of atoms of the silicon, $A_{Si}$, to a sum of the number of atoms of the titanium, $A_{Ti}$, and the number of atoms of the silicon, $A_{Si}$, $\{A_{Si}/(A_{Si}+A_{Ti})\}\times100$, is 1.5% or more and 40% or less.

14. The cutting tool according to claim 1, wherein in the hard particles, a minimum value of a percentage of the number of atoms of the silicon, $A_{Si}$, to a sum of the number of atoms of the titanium, $A_{Ti}$, and the number of atoms of the silicon, $A_{Si}$, $\{A_{Si}/(A_{Si}+A_{Ti})\}\times100$, is 0% or more and 1.5% or less.

15. The cutting tool according to claim 1, wherein a thickness of the hard particle layer is greater than 10 μm and 20 μm or less.

\* \* \* \* \*